United States Patent [19]
Wada et al.

[11] Patent Number: 5,500,056
[45] Date of Patent: Mar. 19, 1996

[54] SOLAR CELL CONTAINING LOW MELTING POINT GLASS LAYER

[75] Inventors: Takahiro Wada, Katano; Mitsusuke Ikeda, Hirakata; Mikihiko Nishitani; Masaharu Terauchi, both of Nara; Takayuki Negami, Katano; Naoki Kohara, Takatsuki, all of Japan

[73] Assignee: Matsushita Electric Industrial Co., Ltd., Osaka, Japan

[21] Appl. No.: 274,722

[22] Filed: Jul. 18, 1994

[30] Foreign Application Priority Data

Jul. 19, 1993 [JP] Japan .................... 5-177882

[51] Int. Cl.⁶ ............... H01L 31/04; H01L 31/0203; H01L 31/0216
[52] U.S. Cl. ............ 136/259; 136/256; 136/260; 136/265
[58] Field of Search .................. 136/252, 256, 136/259–262, 264, 265

[56] References Cited

U.S. PATENT DOCUMENTS

| | | | |
|---|---|---|---|
| 4,239,553 | 12/1980 | Barnett et al. | 136/256 |
| 4,256,513 | 3/1981 | Yoshida et al. | 136/256 |
| 4,633,032 | 12/1986 | Oido et al. | 136/251 |

FOREIGN PATENT DOCUMENTS 53-138287  12/1978  Japan .................... 136/260

OTHER PUBLICATIONS

A. Rocket et al.; "CuInSe₂ for photovoltaic applications", J. Appl. Phys. 70(7), Oct. 1, 1991 pp. R81–R97.

Primary Examiner—Aaron Weisstuch
Attorney, Agent, or Firm—Fish & Richardson

[57] ABSTRACT

A solar cell includes a compound semiconductor, which is a laminated film having compound semiconductor layers, and low melting point glass. When the solar cell is heated by fire, the low melting point glass melts to seal the compound semiconductor so that toxic substances contained in the compound semiconductor are not released into the air.

11 Claims, 6 Drawing Sheets

SOLAR CELL CONTAINING LOW MELTING POINT GLASS LAYER

FIELD OF THE INVENTION

The invention relates to a solar cell having a low melting point glass and a compound semiconductor., which contains heavy metals such as Cd, Se, and the like.

BACKGROUND OF THE INVENTION

A solar cell including a laminated film comprising Cds and a chalcopyrite-type compound semiconductor such as $CuInSe_2$ is is well known. Even though this solar cell is thin, its conversion efficiency is extremely high at about 15%. Like amorphous silicon-based solar cells, moreover, the properties of the solar cell including the laminated film are not deteriorated by light, and this solar cell is expected to replace crystalline silicon-type solar cells which are currently in use. (See Katsumi Kushiya, Nihon Kinzoku Gakkai Kaihou (Bulletin of the Metallurgy Society of Japan), vol. 30, pp. 930–935, 1991.)

However, this solar cell with the laminated film also has a problem, since it contains heavy metals such as Cd, Se, and the like, and these heavy metals are likely to be released at high temperatures, as in a fire, thus polluting the environment.

SUMMARY OF THE INVENTION

An object of the invention is to provide a solar cell having a compound semiconductor, which does not release heavy metals such as Cd and Se, when exposed to high temperatures.

This and other objects and advantages of the invention are attained by a solar cell comprising a compound semiconductor and at least one low melting point glass layer. The compound semiconductor is itself a laminated film comprising compound semiconductor layers, and the low melting point glass layer is formed on at least one surface of the compound semiconductor.

It is preferable that the low melting point glass layer is formed on the entire surface of the compound semiconductor.

It is also preferable that the low melting point glass layer is formed partially on the surface of the compound semiconductor.

It is further preferable that the low melting point glass layer is formed on both the top and bottom surfaces of the compound semiconductor.

It is preferable that the low melting point glass layer has a softening temperature lower than 500° C.

It is also preferable that the low melting point glass layer is 0.1–10 μm thick.

It is further preferable that the low melting point glass layer is made of at least one material selected from the group consisting of $PbO—B_2O_3—SiO_2—Al_2O_3$ glass and $ZnO—B_2O_3—SiO_2$ glass.

It is preferable that the low melting point glass layer is formed by a dry deposition process.

It is also preferable that the dry deposition process is a sputtering method.

It is preferable that the low melting point glass layer is formed on a soda-lime glass substrate, and that the compound semiconductor layers are laminated on the low melting point glass layer.

It is preferable that the compound semiconductor is a chalcopyrite-type compound semiconductor.

It is also preferable that the compound semiconductor comprises at least one element selected from the group consisting of Cd, S, and Se.

It is further preferable that the compound semiconductor comprises at least one layer selected from the group consisting of a $Cu(In,Ga)(Se,S)_2$ layer and a CdS layer.

DETAILED DESCRIPTION OF THE INVENTION

Since the low melting point glass layer is formed on at least one surface of the compound semiconductor of the solar cell of the invention, heavy metals such as Cd, Se, and the like contained in the compound semiconductor are not released at high temperature such as occuring during a fire. More specifically, the low melting point glass layer softens to cover the compound semiconductor before the semiconductor is decomposed into Cd, Se, and the like by heat, so that the release of toxic substances such as Cd and Se into the environment is prevented. In addition, the low melting point glass layer can be formed partially on the surface of the compound semiconductor, since the low melting point glass softens and spreads at high temperatures to seal the compound semiconductor.

$PbO—B_2O_3—SiO_2—Al_2O_3$ glass, $ZnO—B_2O_3—SiO_2$ glass, $B_2O_3—PbO—ZnO$ glass or $B_2O_3—PbO—SiO_2$ glass is used for the low melting point glass layer of the invention.

Figure 1:
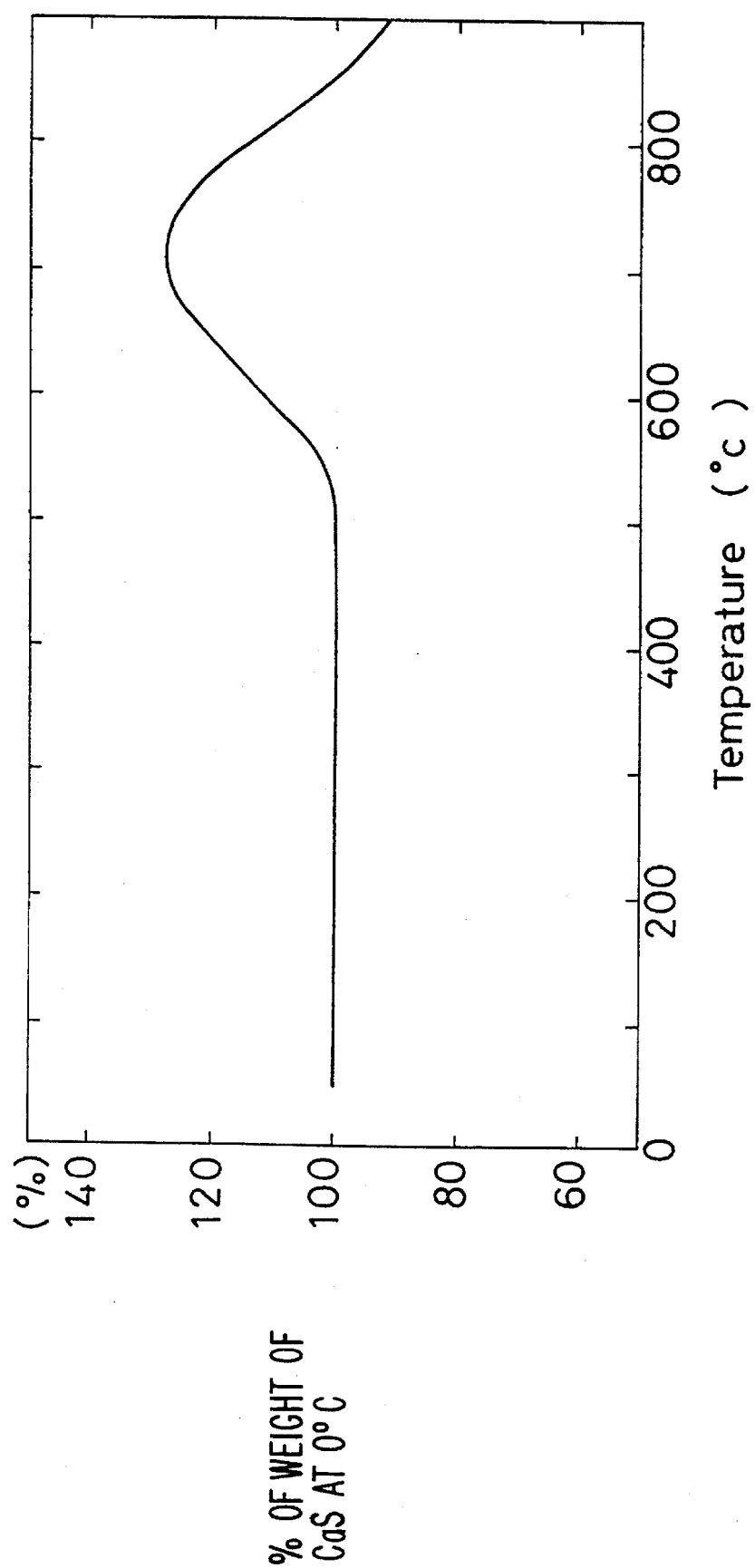
FIG. 1 shows a thermo-gravimetric curve of CdS when CdS is heated in air.

Thermo-gravimetric analyses were performed on CdS, $CuInS_2$, and $CuInSe_2$ in making the invention. FIG. 1 is a graph showing the correlation between the temperature and the weight of CdS. The vertical axis of the graph indicates the fluctuation of the weight in percentage when the weight of CdS at 0° C. is set at 100%. According to FIG. 1, the weight of CdS starts to increase at around 600°C., and then decrease at around 800° C. The increase in the weight of CdS is caused by the formation of sulfate ($SO_4$) while the decrease results from the decomposition of sulfate and the release of sulfur oxides. In addition to sulfur oxides, Cd is partially released at the same time.

Figure 2:
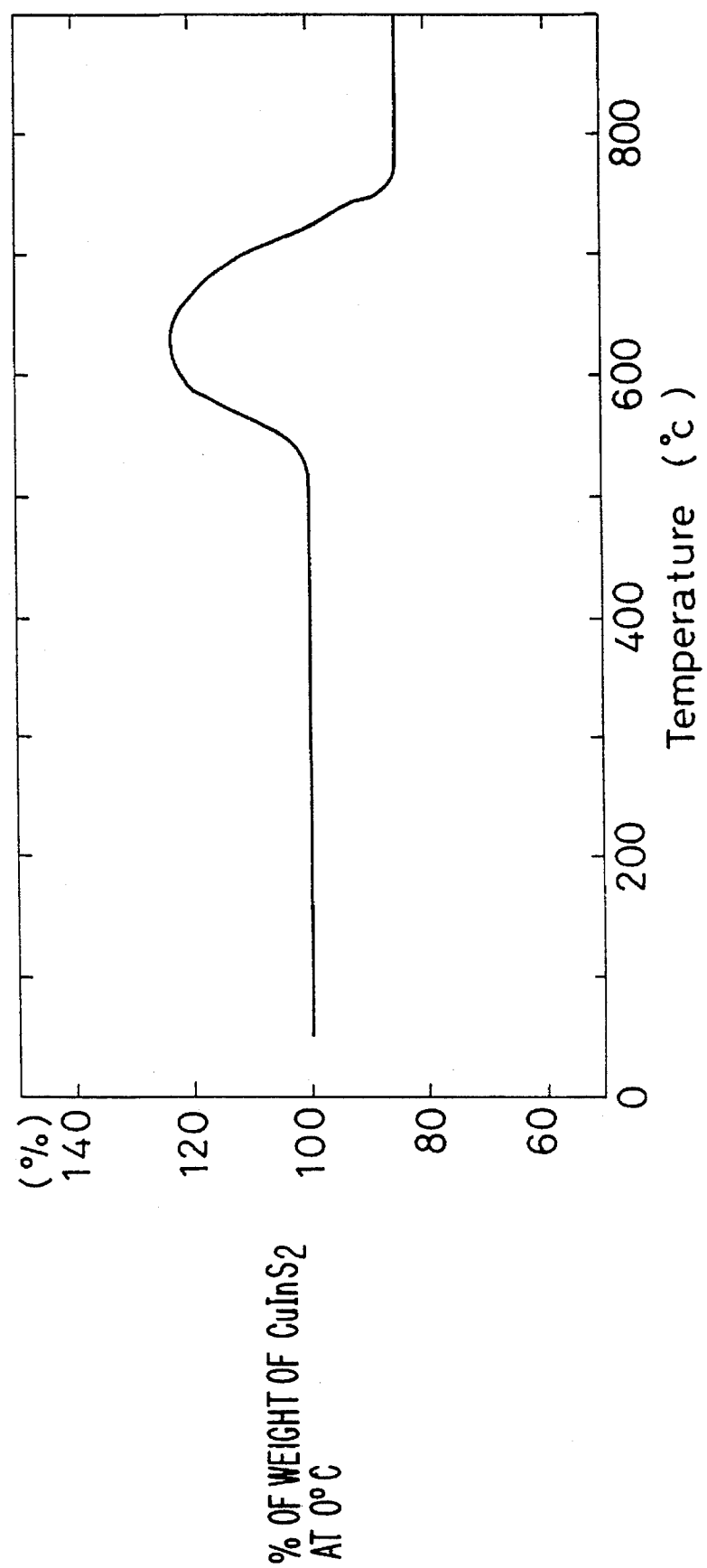
FIG. 2 shows a thermo-gravimetric curve of $CuInS_2$ when $CuInS_2$ is heated in air.

FIG. 2 is a graph showing the correlation between the temperature and the weight of $CuInS_2$. As in FIG. 1, the vertical axis of the graph indicates the fluctuation of the weight (%) while the weight of $CuInS_2$ at 0° C. is set at 100%. According to FIG. 2, the weight of $CuInS_2$ starts to increase at around 500° C., and then decrease at around 600° C. The increase results from the formation of $SO_4$ while the decrease is caused by the decomposition of $SO_4$ and the release of sulfur oxides. Besides sulfur oxides, Cu and In are partially released at the same time.

Figure 3:
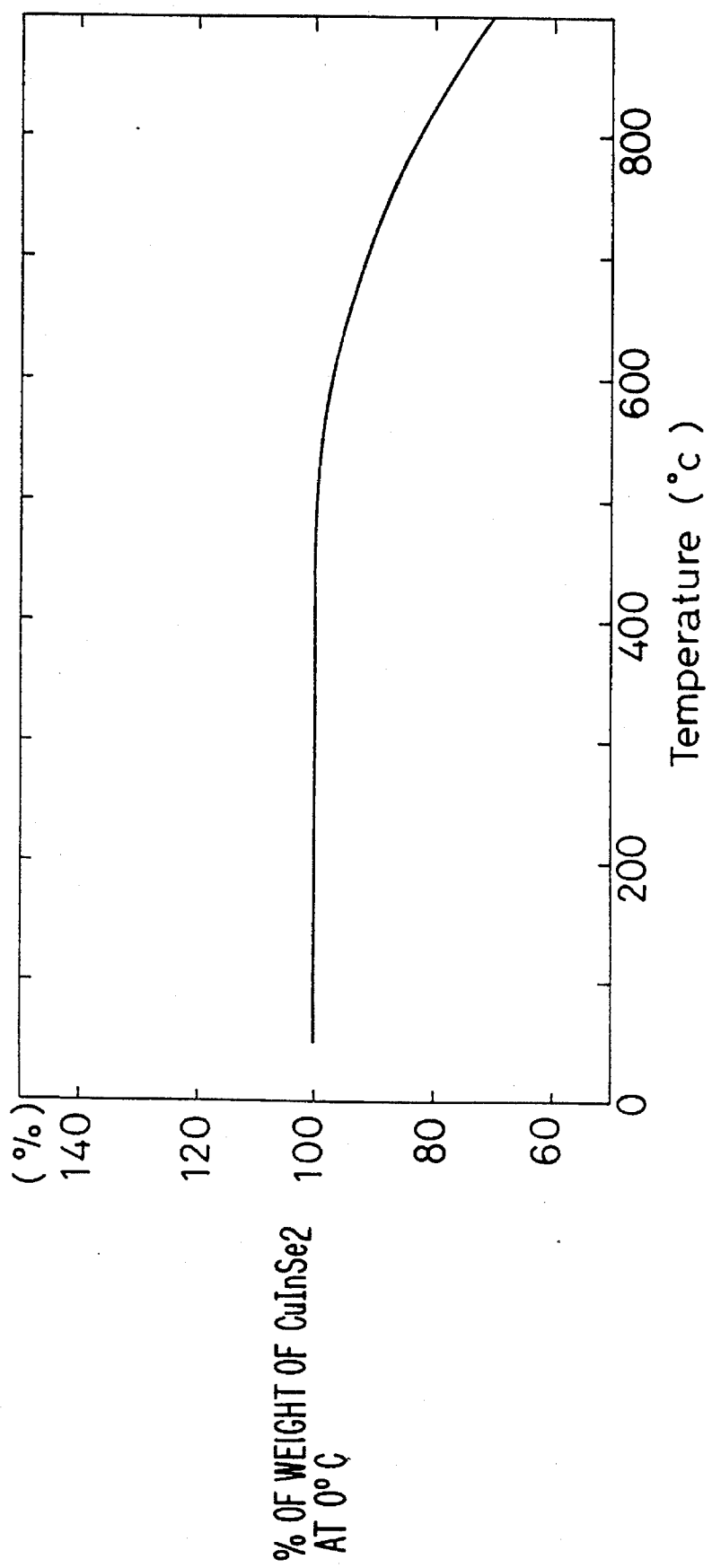
FIG. 3 shows a thermo-gravimetric curve of $CuInSe_2$ when $CuInSe_2$ is heated in air.

FIG. 3 is a graph showing the correlation between the temperature and the weight of $CuInSe_2$. As in FIGS. 1 and 2, the vertical axis of the graph indicates the fluctuation of the weight (%) while the weight of $CuInSe_2$ at 0° C. is set at 100%. According to FIG. 3, the weight of $CuInSe_2$ starts to decrease at around 500° C. The decrease in the weight is caused by the thermal decomposition of $CuInSe_2$ and the release of selenic oxide. Besides selenic oxide, Cu and In are partially released at the same time.

Based on the results of the thermo-gravimetric analyses, all of the compounds ($CdS$, $CuInS_2$, and $CuInSe_2$) are confirmed to be stable at temperatures lower than 500° C. and to decompose at 500° C. or higher. Therefore, it is preferable that the low melting point glass layer of the invention softens at a temperature lower than 500° C. so as to seal the compound semiconductor.

The invention will be explained in detail with reference to the attached figures and the following examples. The examples are illustrative and should not be construed as limiting the invention in any way.

EXAMPLE 1

Figure 4:
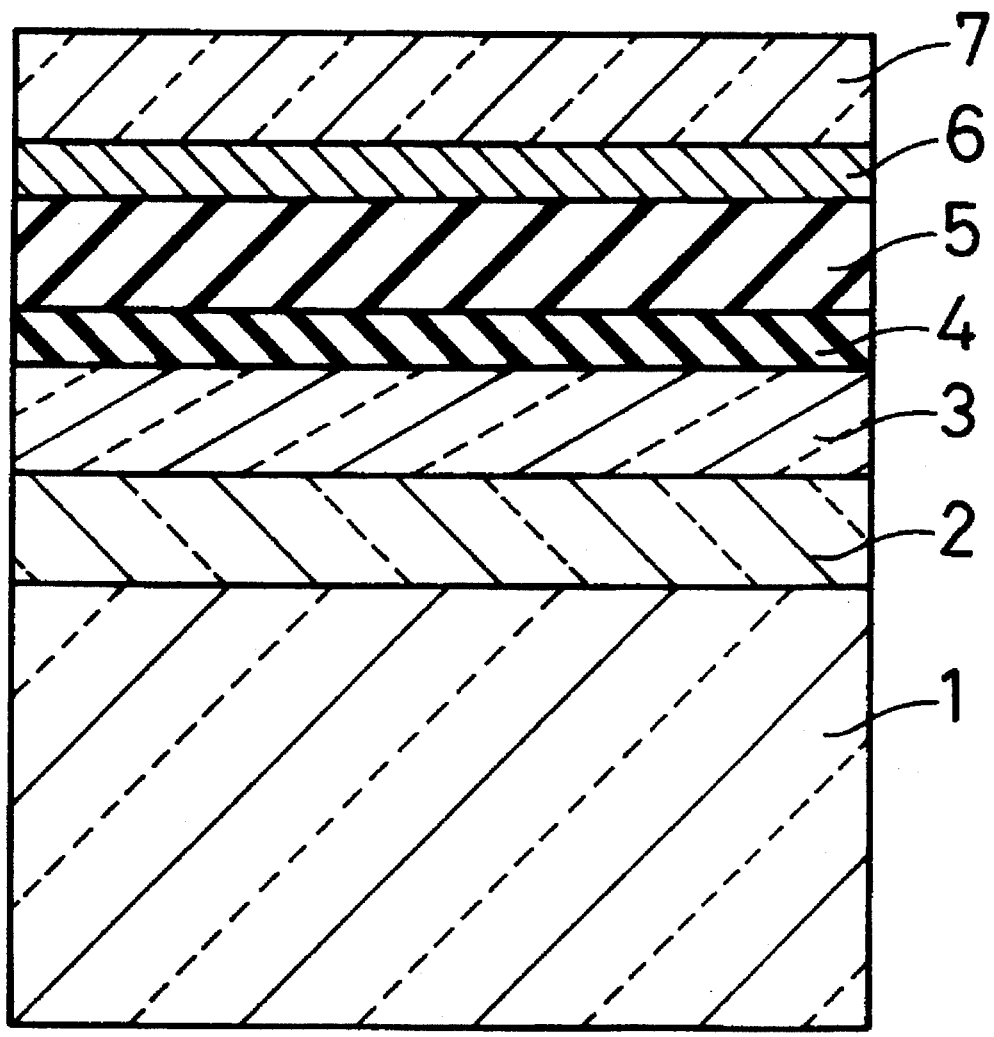
FIG. 4 is a cross-sectional view of a $CdS/CuInSe_2$ solar cell of a first embodiment of the invention.

FIG. 4 is a cross-sectional view of the solar cell of the first embodiment.

A 1 μm thick low melting point glass layer 2 shown in FIG. 4 was coated on a soda-lime glass substrate 1 at room temperature and in an Ar atmosphere by a high-frequency magnetron sputtering method. More specifically, the sputtering was conducted for 10 minutes with 1 KW applied voltage and at $8\times10^{-3}$ Torr vacuum while a 15×15 square inch $PbO—B_2O_3—SiO_2—Al_2O_3$ glass was used as a target. The distance between the target and the substrate was 10 cm. The speed of depositing the $PbO—B_2O_3—SiO_2—Al_2O_3$ glass on the substrate was about 0.1 μm per minute. The material of low melting point point glass layer 2 was $PbO—B_2O_3—SiO_2—Al_2O_3$. The coefficient of thermal expansion of the substrate is preferably the same as the coefficient of thermal expansion of $CuInSe_2$, thus equal to $87\times10^{-7}/°$ C.

Next, a 1.0 μm thick ZnO transparent conductive layer 3 was formed on low melting point glass layer 2 by a sputtering method. A 0.2 μm thick CdS layer 4 was then deposited on ZnO transparent conductive layer 3 as an n-type window layer; a 2.0 μm thick $CuInSe_2$ layer 5 was formed on CdS layer 4 as a light absorbing layer; a 0.1 μm thick Au layer was formed on $CuInSe_2$ layer 5 as a back contact electrode layer 6; a 10 μm thick low melting point glass layer 7 was deposited on back contact electrode layer 6 by a sputtering method. Thus, a solar cell was formed. This sputtering method was performed under the same conditions as the sputtering conditions applied in forming low melting point glass layer 2. The solar cell of this example was then inserted into a metallic frame.

In order to reduce stress generated by the difference in the coefficients of thermal expansion between the substrate and low melting point glass layer 2, the thickness of the glass layer is preferably from 0.1 μm to 2 μm. The thickness of low melting point glass layer 7, is preferably 2–10 μm so that CdS layer 4 and $CuInSe_2$ layer 5 can be sufficiently sealed by the low melting point glass.

When a solar cell is of a substrate type, ZnO, CdS, and $CuInSe_2$ layers are formed at temperatures lower than 300° C. so that a substrate coated with low melting point glass can be applied to the solar cell. The strain point of the low melting point glass of the invention is 361° C.; the annealing point is 370° C.; the transition point is 366° C.; the yield point is 389° C.; and the softening point is 440° C.

Low melting point glass layers 2 and 7 soften at a temperature lower than the thermal decomposition temperature of the compound semiconductor of the example containing heavy metals such as CdS, $CuInSe_2$, and the like, and seal the compound semiconductor when a building where the solar cell of the example is installed is on fire. The softened low melting point glass, in addition, is active enough to seal heavy metals such as Cd, Se, and the like by a chemical reaction with the compound semiconductor so that toxic substances such as Cd, Se, and the like are not released into the air.

In order to test the safety of the solar cell of the example, the solar cell was heated in a gaseous atmosphere, which was a mixture of 80% by volume of $N_2$ gas and 20% by volume of $O_2$ gas, to 850° C. (850° C. is the peak temperature of a normal fire.) Gas generated from the solar cell was absorbed in a nitrate solution and analyzed by an ICP (Inductive Coupled Plasma) emission spectroscopy. Heavy metals such as Cd, Se, and the like could hardly be detected by the analysis.

EXAMPLE 2

Figure 5:
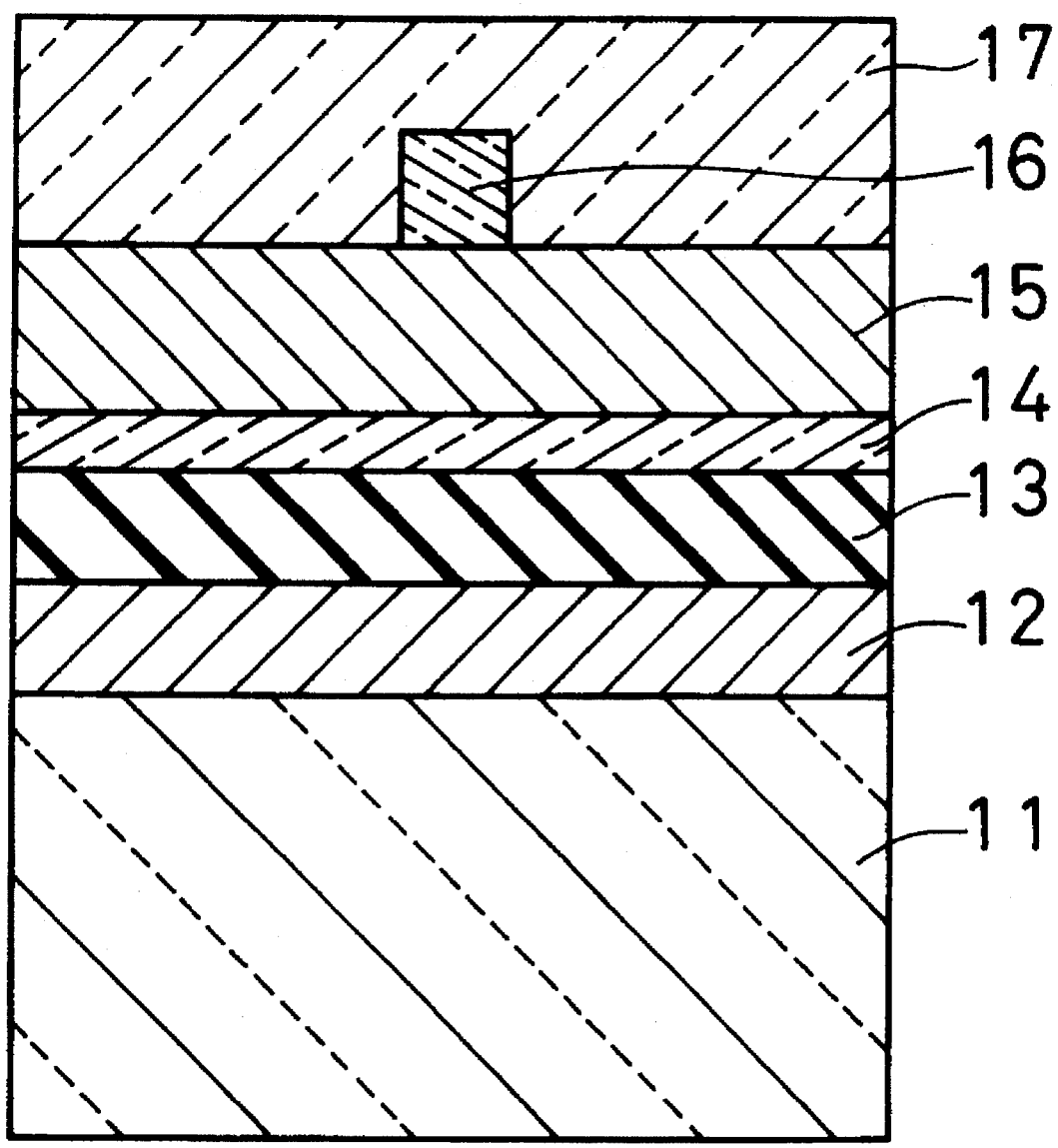
FIG. 5 is a cross-sectional view of a $CdS/CuIn(S, Se)_2$ solar cell of a second embodiment of the invention.

FIG. 5 is a cross-sectional view of the solar cell of the second embodiment.

A 1.0 μm thick bottom electrode 12 shown in FIG. 5 was formed on a soda-lime glass substrate 11 as a Mo layer by a sputtering method. A 3.0 μm thick $Cu(In_{0.8}Ga_{0.2})Se_2$ layer was formed on bottom electrode 12 by a four source evaporation method as a light abosorbing layer 13; a 0.05 μm thick CdS layer 14 was formed on light absorbing layer 13 by a chemical bath deposition method; a 1.0 μm thick ZnO/ITO transparent conductive layer 15 was formed on CdS layer 14; a 2.0 μm thick Ni/Al layer was partially deposited on ZnO/ITO transparent conductive layer 15 as a contact grid 16. A 10 μm thick $ZnO—B_2O_3—SiO_2$ low melting point glass layer 17 was formed on ZnO/ITO transparent conductive layer 15 and contact grid 16 under the same conditions as the sputtering conditions applied during forming of the low melting point glass layer 2 in Example 1. The top surface of the low melting point glass layer 17 was then coated with a cover glass, and the gap between the low melting point glass layer 17 and the cover glass was filled with EVA (ethylene vinyl acetate).

Low melting point glass layer 17 softens at a temperature lower than the thermal decomposition temperature of the compound semiconductor of the example containing heavy metals such as CdS, $CuInSe_2$, and the like, and seals the compound semiconductor when a building where the solar cell of the example is installed is on fire. The softened low melting point glass, in addition, is active enough to seal heavy metals such as Cd, Se, and the like by a chemical reaction with the compound semiconductor so that toxic substances such as Cd, Se, and the like are not released into the air.

In order to test the safety of the solar cell of the example, the cell was heated in a gaseous atmosphere, which was a mixture of 80% by volume of $N_2$ gas and 20% by volume of $O_2$ gas, to 850° C. Gas generated from the solar cell was absorbed in a nitrate solution and analyzed by an ICP emission spectroscopy. Heavy metals such as Cd, Se, and the like could hardly be found by the analysis.

Even if a (Cd, Zn)S layer was used as a window layer and a $CuIn(Se, S)_2$ layer or a $Cu(In, Ga)(Se, S)_2$ layer was used as a light absorbing layer, Cs, Se, and the like could not be detected by ICP emission spectroscopy.

EXAMPLE 3

A tandem solar cell including two laminated solar cells, which have different light absorbing wavelengths from each other, can absorb the wavelengths of the solar spectrum efficiently and has a high conversion efficiency. An example of a tandem solar cell is shown in FIG. 6 and is explained in this example.

Figure 6:
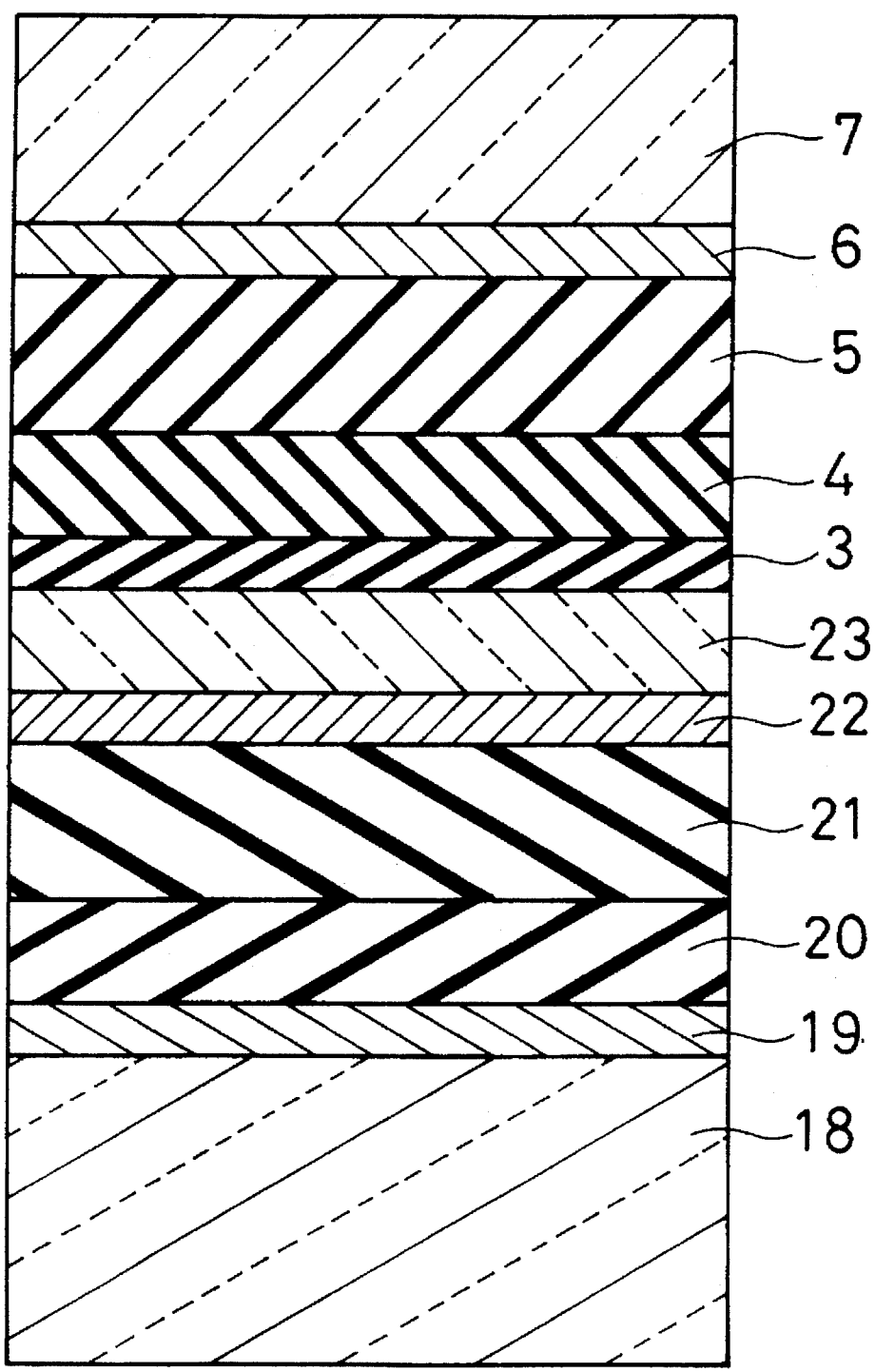
FIG. 6 is a cross-sectional view of a tandem $CdS/CdTe//CdS/CuInSe_2$ solar cell of a third embodiment of the invention.

The tandem solar cell shown in FIG. 6 includes a CdS/CdTe solar cell and a $CdS/CuInSe_2$ solar cell. The light absorbing wavelength of a CdTe layer and a $CuInSe_2$ layer is about 0.85 µm and about 1.2 µm, respectively. Therefore, light with less than 0.85 µm wavelength is absorbed by the CdTe containing solar cell, while light with 0.85–1.2 µm wavelength is absorbed by the $CuInSe_2$ containing solar cell.

In FIG. 6, a substrate 18 was made of Corning glass #7059. ITO/ZnO layers were formed on the substrate as a transparent conductive layer 19 by the same sputtering method as Example 1. On transparent conductive layer 19, a 0.3 µm thick CdS layer 20 as a window layer and a 5 µm thick CdTe layer 21 as a light absorbing layer were formed by a hot wall evaporation method. In this hot wall evaporation method, CdS layer 20 and CdTe layer 21 were deposited on the ITO/ZnO layers, while the space between the evaporating source and the substrate was covered with a cylinder, and the cylinder was heated during the deposition processes. A 1.0 µm thick $SnO_2$ layer was formed on CdTe layer 21 as a transparent conductive layer 22 by a sputtering method, thus completing the CdTe solar cell. The thickness of the ITO layer of transparent conductive layer 19 was 0.2 µm, while the thickness of the ZnO layer of the conductive layer 19 was 0.8 µm.

On transparent conductive layer 22, about 2 µm thick $PbO-B_2O_3-SiO_2-Al_2O_3$ low melting point glass layer 23 was formed by an electron beam evaporation method at room temperature and $2 \times 10^{-6}$ Torr vacuum and with 0.3 A filament current and 10 KV acceleration voltage. The current value and acceleration voltage may be different, depending on the size of the chamber of the evaporation device, the distance between the filament, and the evaporating source and the size of the evaporating source. The speed of depositing the low melting point glass on transparent conductive layer 22 was 0.05 µm per minute. As in Example 1, a ZnO layer 3, a CdS layer 4, a $CuInSe_2$ layer 5 and an Au layer 6 were laminated on the $PbO-B_2O_3-SiO_2-Al_2O_3$ low melting point glass layer, thus manufacturing the $CuInSe_2$ solar cell. A 10 µm thick $PbO-B_2O_3-SiO_2-Al_2O_3$ low melting point glass layer 7 was formed on Au layer 6 under the same conditions as Example 1.

Low melting point glass layers 7 and 23 soften at a temperature lower than the thermal decomposition temperatures of the compound semiconductors containing heavy metals such as CdS, CdTe, $CuInSe_2$, and the like, and seal the compound semiconductors when a building where the solar cell of this example is installed is on fire. Thus, toxic substances such as Cd, Se, Te, and the like are not released into the air from the tandem solar cell of this example.

In order to test the safety of the tandem solar cell of the example, the cell was heated in a gaseous atmosphere, which was a mixture of 80% by volume of $N_2$ gas and 20% by volume of $O_2$ gas, to 850° C. Gas generated from the solar cell was absorbed in a nitrate solution and analyzed by an ICP emission spectroscopy. Heavy metals such as Cd, Se, Te, and the like could hardly be found by the analysis.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A solar cell comprising a compound semiconductor layer and at least one low melting point glass layer, wherein said compound semiconductor layer is a laminated film comprising a plurality of compound semiconductor layers, and wherein said at least one low melting point glass layer has a softening temperature lower than 500° C., and is formed on a soda-lime glass substrate, the compound semiconductor layers being laminated over the low melting point glass layer formed on said soda-lime glass substrate.

2. The solar cell according to claim 1, wherein a low melting point glass layer is formed on an entire surface of the compound semiconductor layer.

3. The solar cell according to claim 1, wherein a low melting point glass layer is formed on part of the surface of the compound semiconductor layer.

4. The solar cell according to claim 1, wherein a low melting point glass layer is formed on both a top and a bottom surface of the compound semiconductor layer.

5. The solar cell according to claim 1, wherein the at least one low melting point glass layer is 0.1–10 µm thick.

6. The solar cell according to claim 1, wherein the at least one low melting point glass layer is made of at least one material selected from the group consisting of $PbO-B_2O_3-SiO_2-Al_2O_3$ glass and $ZnO-B_2O_3-SiO_2$ glass.

7. The solar cell according to claim 1, wherein the at least one low melting point glass layer is formed by a dry deposition process.

8. The solar cell according to claim 7, wherein the dry deposition process is a sputtering method.

9. The solar cell according to claim 1, wherein the compound semiconductor is a Chalcopyrite-type compound semiconductor.

10. The solar cell according to claim 1, wherein the compound semiconductor comprises at least one element selected from the group consisting of Cd, S, and Se.

11. The solar cell according to claim 1, wherein the compound semiconductor comprises at least one layer selected from the group consisting of a $Cu(In,Ga)(Se,S)_2$ layer and a CdS layer.

\* \* \* \* \*